(12) United States Patent
Park

(10) Patent No.: US 6,340,405 B2
(45) Date of Patent: *Jan. 22, 2002

(54) ETCHING APPARATUS FOR MANUFACTURING SEMICONDUCTOR DEVICES

(75) Inventor: Choul-gue Park, Suwon (KR)

(73) Assignee: Samsung Electronics Co., Ltd., Suwon (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/996,100

(22) Filed: Dec. 22, 1997

(30) Foreign Application Priority Data

Dec. 24, 1996 (KR) ............................................. 96-70900

(51) Int. Cl.[7] .............................. B44C 1/22; D05D 3/06; C03C 15/00; C03C 25/06
(52) U.S. Cl. .................... 156/345; 156/643; 156/657; 118/719; 118/731; 118/733
(58) Field of Search ................................ 156/643, 345, 156/657; 118/719, 731, 733

(56) References Cited

U.S. PATENT DOCUMENTS

| | | | | |
|---|---|---|---|---|
| 3,765,763 A | * | 10/1973 | Nygaard | ..................... 355/100 |
| 4,293,249 A | * | 10/1981 | Whelan | ........................ 406/72 |
| 4,439,244 A | * | 3/1984 | Allevato | ...................... 134/33 |
| 4,842,686 A | * | 6/1989 | Davis et al. | ................. 156/143 |
| 5,464,475 A | * | 11/1995 | Sikes et al. | .................. 118/719 |
| 5,556,472 A | * | 9/1996 | Nakamura et al. | .......... 118/719 |
| 5,562,387 A | * | 10/1996 | Ishii et al. | ................... 414/416 |
| 5,780,849 A | * | 7/1998 | Kikuchi | .................. 250/231.13 |
| 5,882,165 A | * | 3/1999 | Maydan et al. | ............. 414/217 |
| 5,944,940 A | * | 8/1999 | Toshima | ..................... 156/345 |
| 5,963,753 A | * | 10/1999 | Ohtani et al. | ............... 396/611 |

* cited by examiner

Primary Examiner—Curtis E. Sherrer
(74) Attorney, Agent, or Firm—Volentine Francos, PLLC

(57) ABSTRACT

An etching apparatus for manufacturing semiconductor devices which reduces contamination of the processing surface of a wafer by transporting a plurality of wafers stacked in a cassette with their processing surfaces facing down from the cassette supply chamber to one or more process chambers where the etching operation is performed on each wafer, one at a time. The apparatus has a load lock chamber for transferring the wafers stacked in the cassette from the cassette supply chamber, which is maintained under atmospheric conditions, to the process chamber, which is maintained under a strong vacuum. The process chamber has a cathode to which a wafer is clamped by a wafer holder with its processing surface facing down; the process chamber may also have a removable lower cover for easy repair and cleaning. The apparatus may also have a wafer aligning chamber installed between the cassette supply chamber and the load lock chamber for simultaneously aligning all of the wafers n the cassette before they are transported to the load lock chamber. The wafer aligning chamber also has a cassette transport mechanism for transferring the cassette from a cassette supply table in the cassette supply chamber to an elevator installed in the load lock chamber.

17 Claims, 13 Drawing Sheets

ETCHING APPARATUS FOR MANUFACTURING SEMICONDUCTOR DEVICES

BACKGROUND OF THE INVENTION

1. Field of the Invention

The present invention relates to an etching apparatus for manufacturing semiconductor devices, and more particularly, to an etching apparatus which reduces contamination of the surface of wafers during the step of transporting wafers to a process chamber and the step of etching the wafer as well as reducing the time it takes to transport and etch the wafers.

2. Discussion of Related Art

The manufacture of semiconductor devices involves many processes, including photolithography, etching, and thin film fabrication, which are repeatedly performed during the manufacturing process. The etching process is required to eliminate any unnecessary film on the wafer, and can be divided into wet-etching processes utilizing chemicals, and dry-etching processes utilizing plasma.

FIGS. 1 and 2 schematically illustrate the structure of a conventional dry-etching apparatus. The conventional dry-etching apparatus has multiple process chambers 1; a load lock chamber 3 disposed between the process chamber 1 and the wafer supply mechanism part 2 which supplies wafers W to the vacuum process chamber 1 with the processing surface of the wafers facing up; and an aligner 4 for aligning a flat edge of the wafer W so that the wafers W are aligned before they are supplied to process chamber 1.

In the conventional apparatus, process chamber 1 has a cathode 5 on which the wafer W is laid with the processing surface of the wafer facing upward. The gas supply diffuser 11 supplies a process gas to process chamber 1 wherein the gas immediately forms a plasma that etches the upward-facing processing surface of the wafer. The inside of processing chamber 1 is maintained under a strong vacuum to assure a stable etching process.

Inside load lock chamber 3, there is an elevator 6 and a robot 7. The arm 12 of the robot 7 loads wafers from cassette 8 of the wafer supply mechanism 2 onto elevator 6, where the wafers W are stacked. The arm 12 of robot 7 takes one wafer W at a time from the elevator 6 as arm 12 moves up and down to align the wafer through the aligner 4. Arm 12 then transports wafer W to process chamber 1 where the etching step takes place. After etching, the wafer W is loaded in wafer block 9 on the elevator 6 and is returned to the wafer supply mechanism 2.

Transporting wafers W from the wafer supply mechanism 2 to the process chamber 1 is a slow process. First, the wafers W stacked in the cassette 8 of the wafer supply mechanism 2 are transported one by one, and sequentially inserted into the wafer block 9 of the load lock chamber 3. The wafer supply mechanism 2 has a table 10 on which at least one cassette 8 is laid. The table 10 moves horizontally to the left and right, and thus allows for a continuous supply of wafers W stacked in multiple cassettes 8. The wafers W in the wafer block 9 are then transported one by one to the aligner 4 where their flat edges are aligned. After aligning, the wafers W are transported one at a time with the processing surface facing upward to the process chamber 1 where they are etched. In the conventional apparatus, the wafers are transported and aligned individually which is slow and inefficient, resulting in decreased productivity.

The wafer supply mechanism 2 is maintained under atmospheric conditions, while the process chamber 1 is maintained under a strong vacuum to facilitate the plasma etching step. When the wafers W are transported to the wafer block 9 inside the load lock chamber 3 from the wafer supply mechanism 2, care must be taken to maintain the path to the process chamber 1 from the load lock chamber 3 in the high vacuum state. To accomplish this, load lock chamber 3 is maintained under atmospheric conditions while the wafer W is transported from wafer supply mechanism 2 to load lock chamber 3. Before transporting the wafer W from the load lock chamber 3 to the process chamber 1, the path between the load lock chamber and the wafer supply mechanism 2 is closed. The path between load lock chamber 3 and process chamber 1 is then opened so that the load lock chamber 3 can be put under a high vacuum thereby reducing the pressure difference between load lock chamber 3 and process chamber 1.

Contamination of the surface of the wafer W causes failures in the etching process. Therefore, it is important that the inside of the load lock chamber 3 and the process chamber 1 be clean. It is also necessary that the apparatus itself be placed in a clean environment to effectively prevent contamination of the wafer and the chambers of the apparatus.

There is a high risk of contamination of the upward-facing processing surface of the wafers W from particles that become attached to the surface as the wafers W are transported from the wafer supplying part 2 through load lock chamber 9 to the process chamber 1 where they are etched. Therefore, a need exists for an etching apparatus for manufacturing semiconductor devices that is faster and more efficient, and that reduces particle contamination of the wafer surface.

SUMMARY OF THE INVENTION

An objective of the present invention is to provide an etching apparatus for manufacturing semiconductor devices which reduces contamination of the processing surface of the wafers caused by environmental contaminants while the wafer is transported back and forth between the wafer supply mechanism and the process chamber where the wafer is etched.

It is another aspect of the present invention to reduce the process time required to transport the wafers back and forth between the wafer supply mechanism and the process chamber where the wafer is etched, and the time required to align the flat edges of the wafers, thereby enhancing operational efficiency of the etching apparatus.

To achieve these and other advantages, the present invention provides an etching apparatus for manufacturing semiconductor devices, having one or more process chambers for etching a wafer with the processing surface facing down during the etching step. The apparatus has a cassette supply chamber for supplying a plurality of wafers to the process chamber, and the cassette supplying chamber has a cassette supply table for receiving a cassette housing a plurality of wafers stacked in the cassette with their processing surfaces facing down. A load lock chamber is provided for transferring the wafers housed in the cassette from the cassette supply chamber which is maintained under atmospheric conditions, to the process chamber which is maintained under a strong vacuum, the load lock chamber being installed between the process chamber and the cassette supply chamber, and having an elevator for moving the cassette up and down. The load lock chamber also has a wafer transporting mechanism for transferring the wafers from the cassette to the process chamber one by one while"

maintaining the orientation of each wafer with the processing surface facing down; and a cassette transport mechanism for transferring the cassette from the cassette supply table in the cassette supply chamber to the elevator in the load lock chamber.

In a preferred embodiment, the process chamber encompasses a sealed volume and has a side opening in communication with the load lock chamber which opening is sealed by a door, and a removable lower cover for easy cleaning and repair. The process chamber also has a cathode installed in the top part inside the chamber body, onto which cathode the wafer is clamped with its processing surface facing down to minimize contamination of the surface of the wafer during transport to and from the process chamber and during etching. The process chamber has a wafer loading mechanism for receiving the wafer supplied to the process chamber from the load lock chamber, and for clamping the wafer against the cathode. Finally, the process chamber has a process gas supplying component installed in the bottom of the chamber body for supplying the process gas to the chamber for etching the downward-facing wafer processing surface.

In a preferred embodiment, the wafer loading mechanism has a wafer loader for loading the wafer onto the cathode and a wafer holder for clamping the wafer onto the cathode. The positions of the wafer loader and the wafer holder are determined by sensors. In another aspect of the present invention, the wafer loader and the wafer holder are moved up and down inside the process chamber by a driving means that is driven by pneumatic pressure.

In a preferred embodiment, the etching apparatus has a process gas supply component, comprising a gas spray plate having a plurality of gas orifices that is installed in the bottom of the chamber body at an interval above the lower cover. Process gas is supplied by a gas supply line that passes through the lower sidewall of the process chamber body with one end of the line passing through the gas spray plate and terminating at a point between the gas spray plate and the lower cover, thereby supplying process gas to the space between the gas spray plate and the lower cover.

In another aspect of the invention, the cassette supply chamber has a cassette supply table that has multiple fixing tables stacked at a predetermined interval from each other for receiving a cassette. The fixing tables have pneumatically driven clamping bars to fix and hold the cassette, and they can move up and down depending on the direction of rotation of a ball screw that is driven by a motor.

In another preferred embodiment, the etching apparatus of the present invention has a wafer aligning chamber containing a wafer aligning mechanism installed between the cassette supply chamber and the load lock chamber for simultaneously aligning the multiple wafers stacked in the cassette, and for transferring the cassette to the load lock chamber.

BRIEF DESCRIPTION OF THE ATTACHED DRAWINGS

The accompanying drawings illustrate embodiments of the invention, in which.

DETAILED DESCRIPTION OF PREFERRED EMBODIMENT

An etching apparatus for manufacturing semiconductor devices will be hereinafter described in detail with reference to FIG. 3 through FIG. 19.

Figure 1:
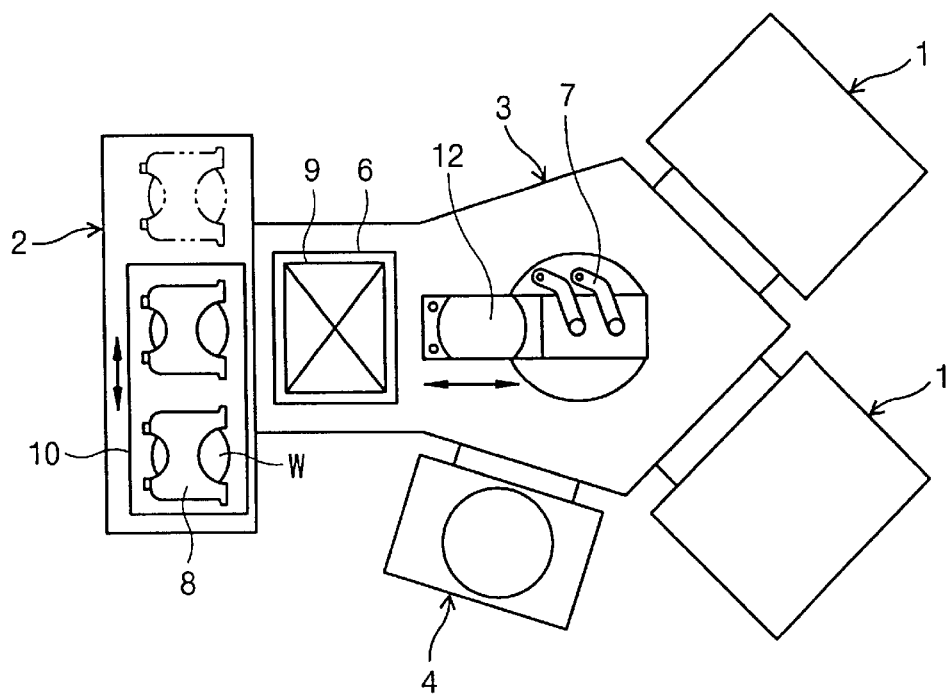
FIG. 1 is a plan view illustrating the inner structure of a conventional etching apparatus.
Figure 2:
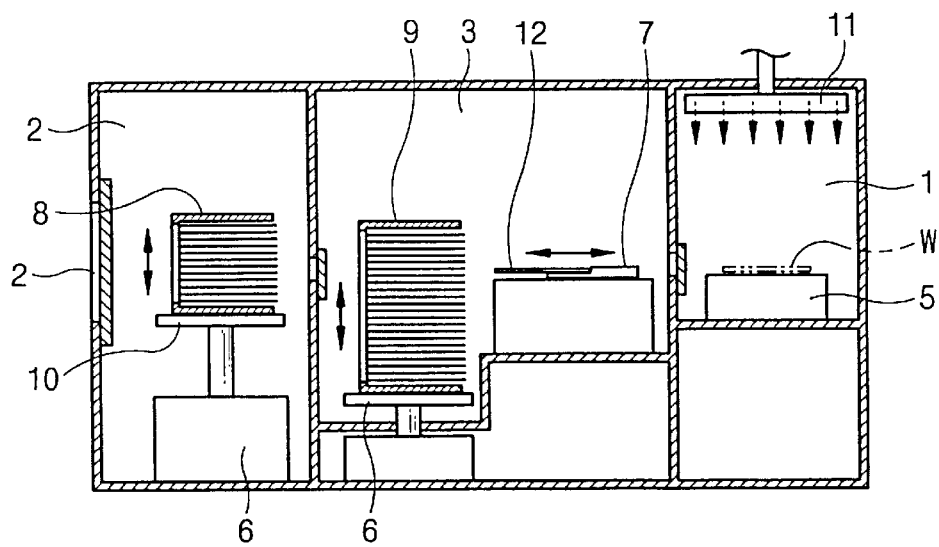
FIG. 2 is a side cross section schematically illustrating the inner structure of the conventional etching apparatus.
Figure 3:
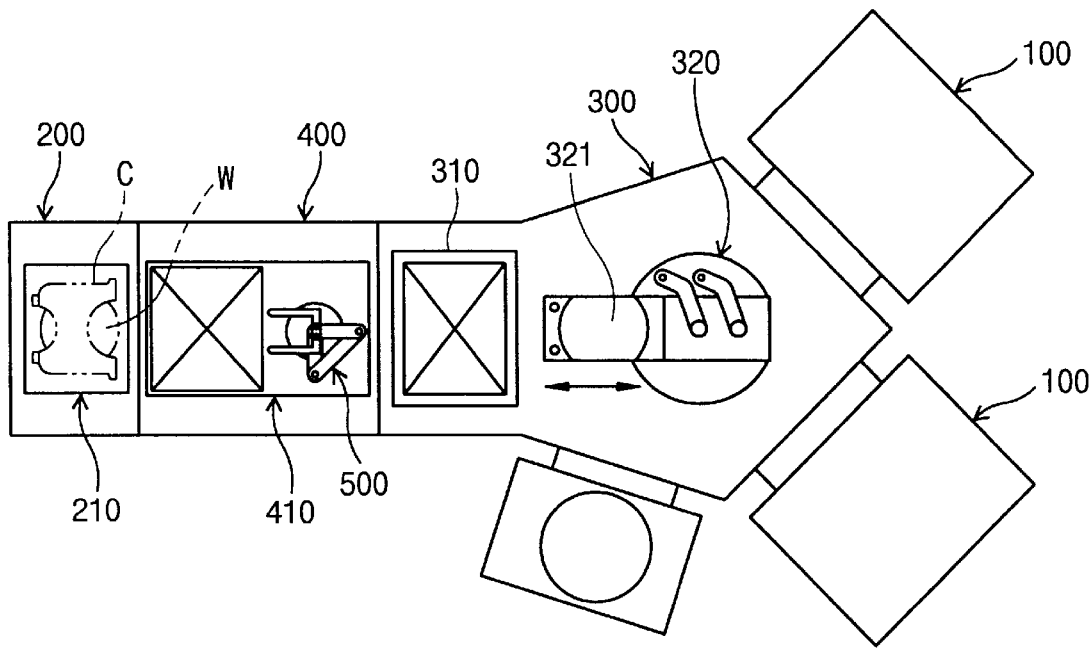
FIG. 3 is a top view schematically illustrating the inner structure of an etching apparatus of the invention.
Figure 4:
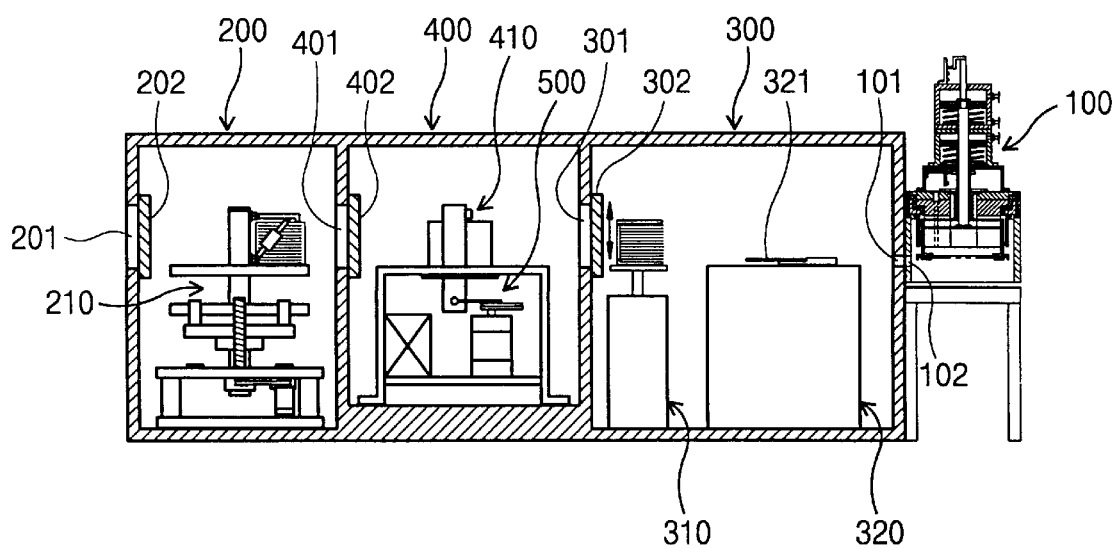
FIG. 4 is a cross section schematically illustrating the inner structure of the etching apparatus of the invention.

As illustrated in FIGS. 3 and 4, the etching apparatus of the invention includes: one or more process chambers 100 for performing the etching process, in which the surface of a wafer faces down. A cassette supplying chamber 200 supplies the wafer W to the process chamber 100. The cassette supplying chamber 200 has a cassette supply table 210 on which a cassette C is loaded with multiple wafers W stacked therein so that their processing surfaces face down. A load lock chamber 300, installed between the process chamber 100 and the wafer supply chamber 200, receives the wafer W stored in cassette C from the cassette supply chamber 200, which is maintained under atmospheric conditions, and transfers the wafer W to the process chamber 100, which is maintained under a high vacuum. Inside the load lock chamber 300 there is an elevator 310 for moving the cassette C up and down, and a wafer transport mechanism 320 for transferring the wafers W with their processing surfaces facing down, one by one from the cassette C to the process chamber 100.

In a preferred embodiment, a wafer aligning chamber 400 is installed between the cassette supply chamber 200 and the load lock chamber 300. The wafer aligning chamber 400 includes a wafer aligning mechanism 410 which simultaneously aligns the flat edges of the wafers W that are stacked in the cassette C. A cassette transport mechanism 500 transfers the wafers W from the cassette C in the cassette supply chamber 200 to the wafer aligning chamber 400 and the load lock chamber 300. The cassette transport mechanism 500 may be a robot, for example.

The cassette supply chamber 200, the wafer aligning chamber 400, the load lock chamber 300, and the process chamber 100 are sequentially arranged side by side from left to right as is shown in FIG. 3 and FIG. 4. An opening 201 for transporting the cassette C into cassette supply chamber 200 is formed on one side of the cassette supplying chamber 200. The path is opened/closed by a door 202. Opening 401 is formed between the wafer supply chamber 200 and the wafer aligning chamber 400, for transferring cassette C between chambers 200 and 400. Opening 301 is located between wafer aligning chamber 400 and load lock chamber 300. The openings 401 and 301 are opened/closed by doors 402 and 302, respectively. An opening 101 exists between the load lock chamber 300 and the process chamber 100, enabling a wafer W to pass from load lock chamber 300 into process chamber 200 where the downward-facing processing surface of wafer W is etched. The opening 101 is also opened/closed by a door 102.

Cassette C, housing multiple wafers W, is transported from the cassette supply table 210 in the cassette supply chamber 200 to the wafer aligning mechanism 410 in the wafer aligning chamber 400 using the cassette transporting mechanism 500 installed in the wafer aligning chamber 400. Opening 301 between the wafer aligning chamber 400 and the load lock chamber 400 is closed by the door 302 at this point. All of the wafers housed in cassette C are simultaneously aligned by wafer aligning mechanism 410 before the cassette C is transported into load lock chamber 300.

Once cassette C has been transported into wafer aligning chamber 400 and the wafers W have been aligned, opening 401 between the cassette supplying chamber 200 and the wafer aligning chamber 400 is closed by the door 402. Next, the door, 302 to the load lock chamber 300 is opened, and the cassette C is transported from the wafer aligning chamber 400 to the elevator 310 in the load lock chamber 300 using the cassette transporting mechanism 500. Once cassette C is inside load lock chamber 300, opening 301 is closed by door 302.

The process chamber 100 must be maintained at a high-vacuum throughout the process of transferring each wafer W from the cassette C on the elevator 310 to the process chamber 100 where it is etched. To maintain a high vacuum, the opening 301 leading from load lock chamber 300 to the wafer aligning chamber 400 is sealed by closing door 302. The load lock chamber 300 is then placed under a vacuum to reduce the pressure difference between the load lock chamber 300 and the process chamber 100. Once the proper vacuum is achieved, the wafers are supplied, one by one with the processing surface facing down, to the process chamber 100 through opening 101 using the wafer transport mechanism 320 where each wafer is individually and sequentially etched.

After each wafer W has been etched in process chamber 100, it is re-stacked in the cassette C on the elevator 310 by the wafer transport mechanism 320. Elevator 310, on which the cassette C is laid, moves up and down to facilitate the sequential transfer of each wafer back and forth between the cassette C and process chamber 100 using the wafer transporting mechanism 320.

Once all the wafers have been etched and returned to the cassette C resting on the elevator 310, the opening 101 between the load lock chamber 300 and the process chamber 100 is shut tightly to maintain the vacuum state in the process chamber 100. At this point, the openings 301 and 401 of the respective load lock chamber 300 and the wafer aligning chamber 400 can be safely opened. The cassette transporting mechanism 500 transfers the cassette C from the elevator 310 through the openings 301 and 401, to the cassette supply table 210 in the cassette supply chamber 200. The wafers W are oriented with their processing surfaces still facing down throughout the transfer from the cassette supply chamber 200 to the process chamber 100 and throughout the etching process. The wafers W are transported in cassette C back to cassette supply chamber 200 facing down in order to minimize the attachment of particulate contaminants on the etched surface of the wafer W.

The present invention permits a more rapid transfer of the cassette C from the cassette supplying chamber 200 to the load lock chamber 300 than the conventional etching apparatus. Further, the present invention also permits the simultaneous alignment of multiple wafers W stacked in the cassette C which saves time.

Figure 5:
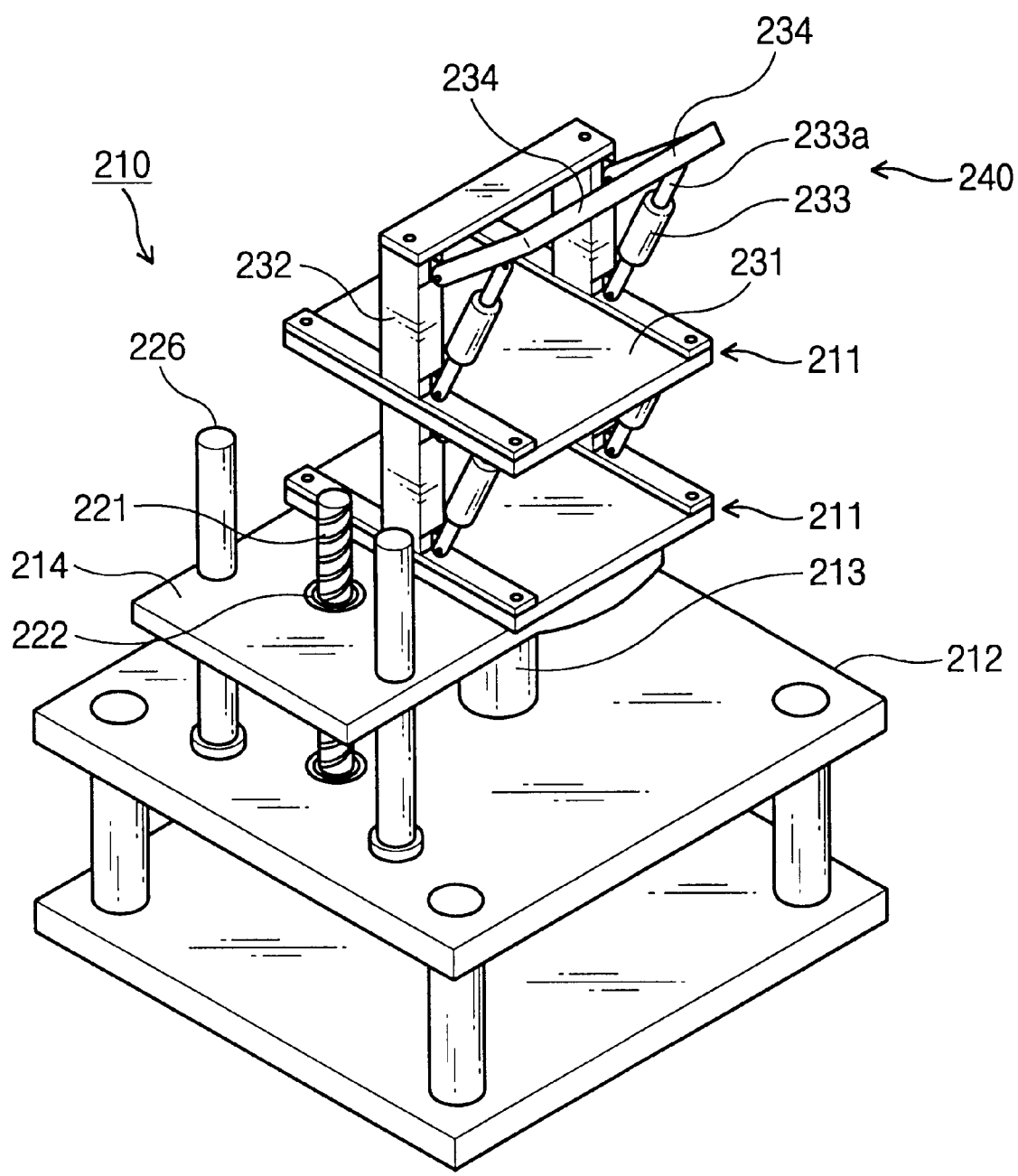
FIG. 5 is a perspective view illustrating a cassette supply table of the etching apparatus of the invention.
Figure 6:
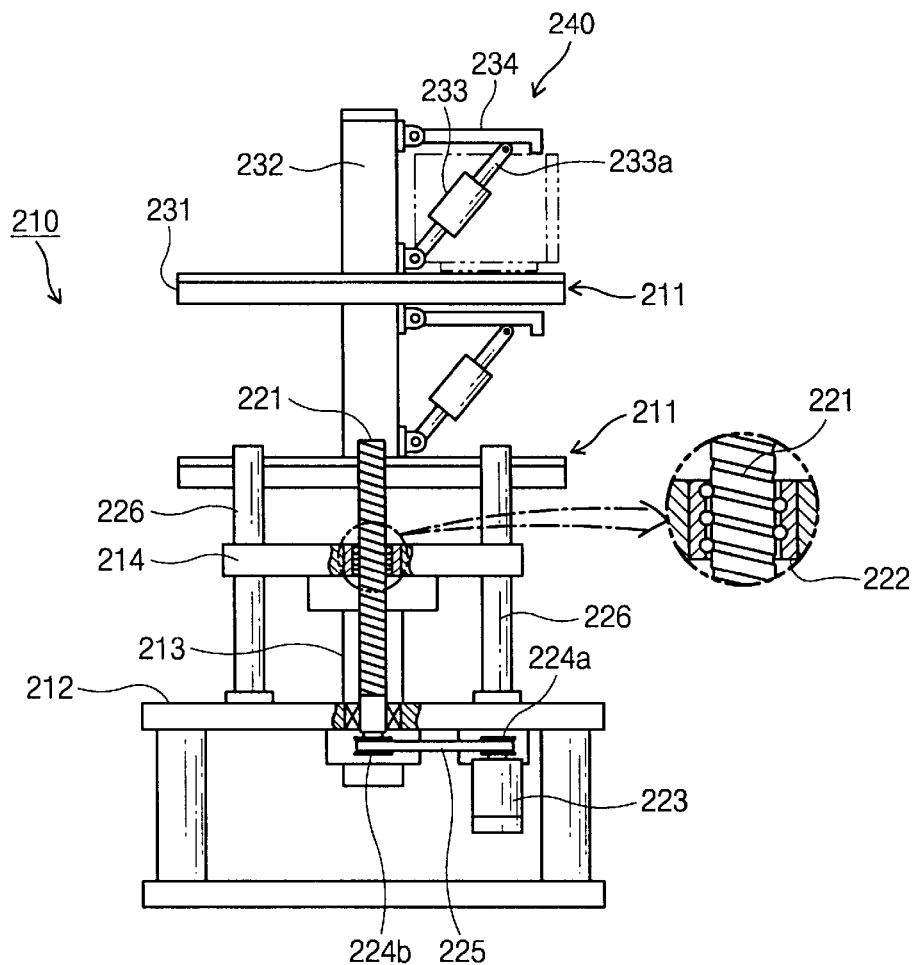
FIG. 6 is a frontal view illustrating the cassette supply table of the etching apparatus of the invention.
Figure 7:
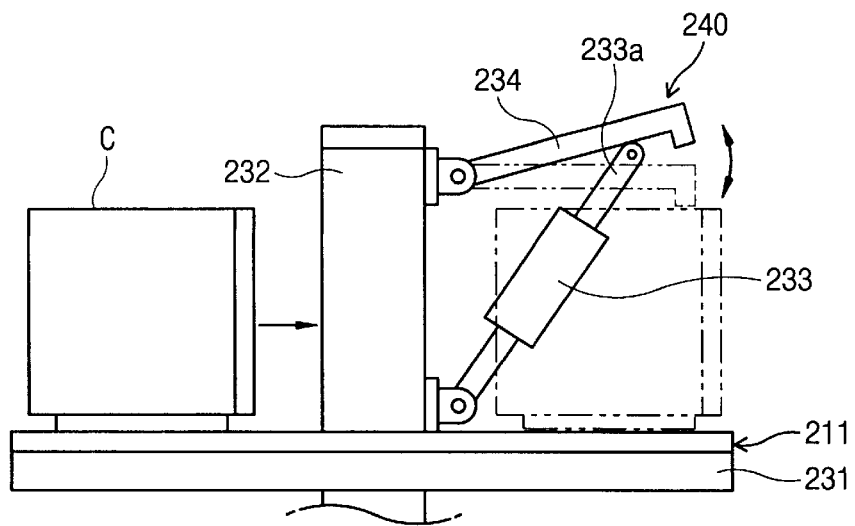
FIG. 7 is a detail of the "clamping bar" of FIG. 6.
Figure 8:
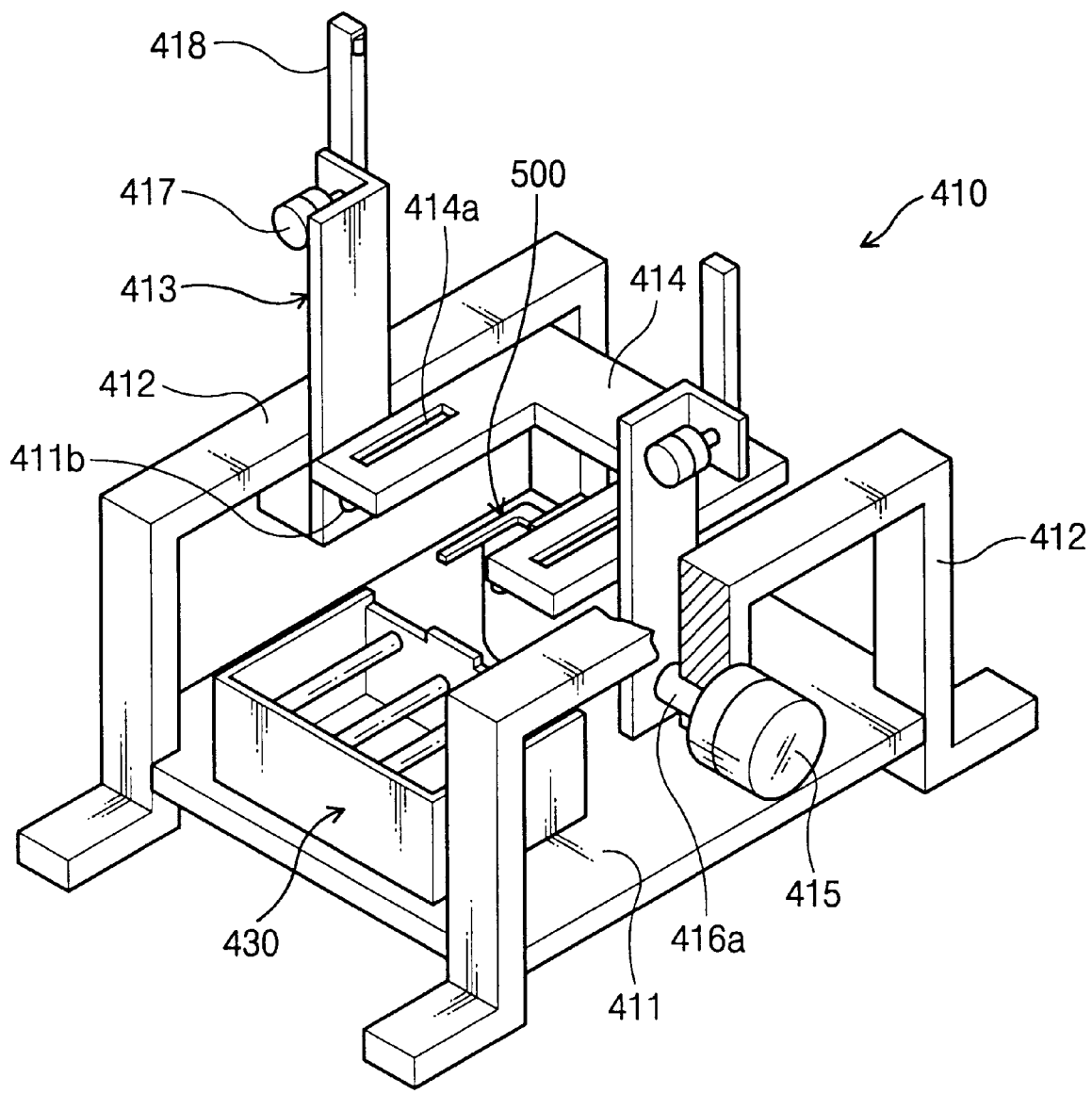
FIG. 8 is a perspective view illustrating a wafer aligning mechanism of the etching apparatus of the invention.

FIGS. 5 to 7 illustrate the cassette supply table 210 installed in the cassette supplying chamber 200 of the etching apparatus of the present invention. The cassette supplying table 210 is composed of multiple fixing tables 211 for receiving a cassette C, stacked at a predetermined interval from each other. Cassette C, housing multiple wafers W stacked with their processing surfaces facing down, is laid on the fixing tables 211. The multiple fixing tables 211 are installed on the lower base table 212 and move vertically. A support column 213, fixed to the bottom of the lowest fixing table 211, passes through the lower base table 212 to support the base table. The fixing table is automatically controlled by an elevating mechanism to move up and down to predetermined heights.

The vertical shifting means includes: a ball screw 221 passing through the base table 212 and the latitudinal plate 214, and extending upward through the latitudinal plate; a ball bearing 222 attached to latitudinal plate 214 installed between the latitudinal plate and supporting the ball screw 221; a motor 223 for rotating the ball screw 221; and a pair of pulleys 224a and 224b and a belt 225 for transmitting power from the motor 223 to the ball screw 221. Guide rods 226 pass through the latitudinal plate 214 on both sides of the ball screw 221, where the lower side of the rod is fixed to the base table 212 to guide the latitudinal plate 214 linearly as it moves along the ball screw 221.

Accordingly, when the ball screw 221, connected to motor 223 by a pair of pulleys 224a and 224b and belt 225, rotates under the power of driving motor 223, the multiple fixing tables 211 move up and down by the ball bearing 222. The fixing tables 211 move linearly without rotating, centered on support column 213, so that the supporting column 213 supports the linear movement of the fixing tables 211.

The vertically shifting fixing tables 211 are positioned in front of the opening 401 leading from cassette supply chamber 200 to the wafer aligning chamber 400 by the driving motor, as illustrated in FIG. 4. Once the cassette support table 210 has moved cassette C into its proper position, cassette C can be transferred by the cassette transport mechanism 500 from cassette supply chamber 200 into wafer aligning chamber 400 through opening 401.

Two fixing tables 211 are illustrated in the drawing, but more can be used in the actual embodiment. Each fixing table 211 on which the cassette C is loaded includes a support board 231, vertical bars 232 attached to both sides of the supporting board 231, and fixing mechanism 240 for preventing the cassette C from shifting out of position. The fixing mechanism 240 has pneumatic actuating cylinders 233 installed under the vertical bars 232, to move clamping bars 234, installed on both sides of the vertical bars 232, allowing the both ends of the clamping bars 234 to rotate. Rods 233a of each pneumatic actuating cylinder 233 are connected to the free-end of the clamping bars 234 enabling the clamping bars to clamp and release cassette C.

As illustrated in FIG. 7, as the clamping bar 234 rotates according to the linear movement of the rod 233a during the operation of the pneumatic actuating cylinder 233, it is possible to clamp or release the cassette C by pushing down on the upper surface of cassette C placed on the supporting board 231. When the fixing tables 211 are raised or lowered, the pneumatic actuating cylinders 233 are activated, enabling the clamping bars 234 to secure the cassette C, in order to prevent the cassette C from shifting out of place. When transporting the cassette C to the wafer aligning chamber 400, or when returning cassette C to each fixing table 211, the clamping action of clamping bar 234 is released to enable the transportation of cassette C.

FIGS. 8 through 14 illustrate the wafer aligning mechanism 410 installed in the wafer aligning chamber 400 and the cassette transport mechanism 500 in the etching apparatus of the present invention. The wafer aligning mechanism 410, as illustrated in FIGS. 8 through 12, includes a base 411, an aligning table 413 to which a vertical frame 412 is attached, an aligning plate 414 installed within the vertical frame 412 of the aligning table 413 to receive the cassette C, and a wafer aligner 430 installed on the base 411 for simultaneously aligning the flat edges of the wafers W stacked in the cassette C.

The aligning plate 414 is made to rotate 90° around shafts 416a and 416b under the power of the gear-reduced motor 415, thereby rotating the cassette C laid on the aligning plate 414 by 90°, so that the wafers W stacked in cassette C can be transported onto the wafer aligner 430. Clamping bars 418 installed on both sides of the aligning plate 414 rotate, powered by a small driving motor 417, and clamp the sides of the cassette C.

A slide preventing groove 414a, into which two or more supporting legs 414b of the cassette C are inserted, is cut into the floor of aligning plate 414 on which the cassette C rests, so that the cassette C does not shift when clamped by the clamping bars 418. After the cassette C has been transported from the cassette supplying chamber 200 by the cassette transporting mechanism 500, it is laid on the aligning plate 414. Both of the clamping bars 418 powered by the motor 417, push on the cassette C thereby pushing cassette C onto the wafer aligner 430 as the aligning plate 414 rotates 90° under the power of gear reduced motor 415. This operation simultaneously aligns the wafers W stacked in the cassette C. When the alignment of the wafers W is complete, the aligning plate 414 rotates in the reverse direction by 90° thereby returning the cassette C to its original position.

Figure 11:
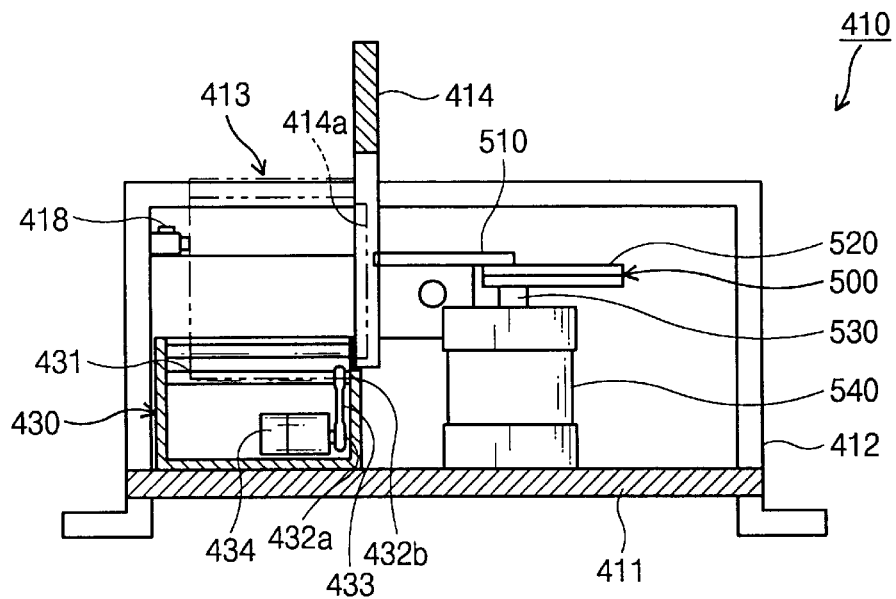
FIG. 11 is a cross section illustrating the operating state of the aligning table of the wafer aligning mechanism of the etching apparatus of the invention.
Figure 12:
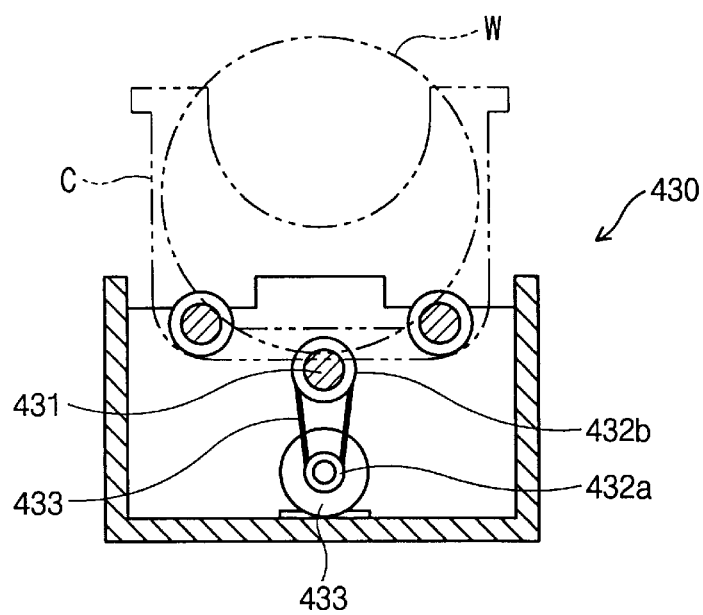
FIG. 12 is a cross section of the wafer aligner of the wafer aligning mechanism for the etching apparatus of the invention.

As illustrated in FIGS. 11 and 12, the wafer aligner 430 has three rollers 431, the central roller being slightly lower than the rollers on either side. The central roller 431 is powered by a motor 434 connected to it by a pair of pulleys 432a and 432b and a belt 433. When the cassette C is placed on the wafer aligner 430, the external circumference of the wafers W contacts the three rollers 431. When the central roller 431 is rotated by the motor 434, those wafers W whose edges make contact with the central roller 431 are rotated. The wafers will continue rotating as long as the wafer edge contacts the central roller 431. However, when the flat side of the wafer faces the central roller 431, contact with the central roller 431 is broken and the wafer stops rotating, causing the wafers to be aligned with the flat edges of the wafers W over the central roller 431. In this way, multiple wafers W are simultaneously aligned.

Figure 9:
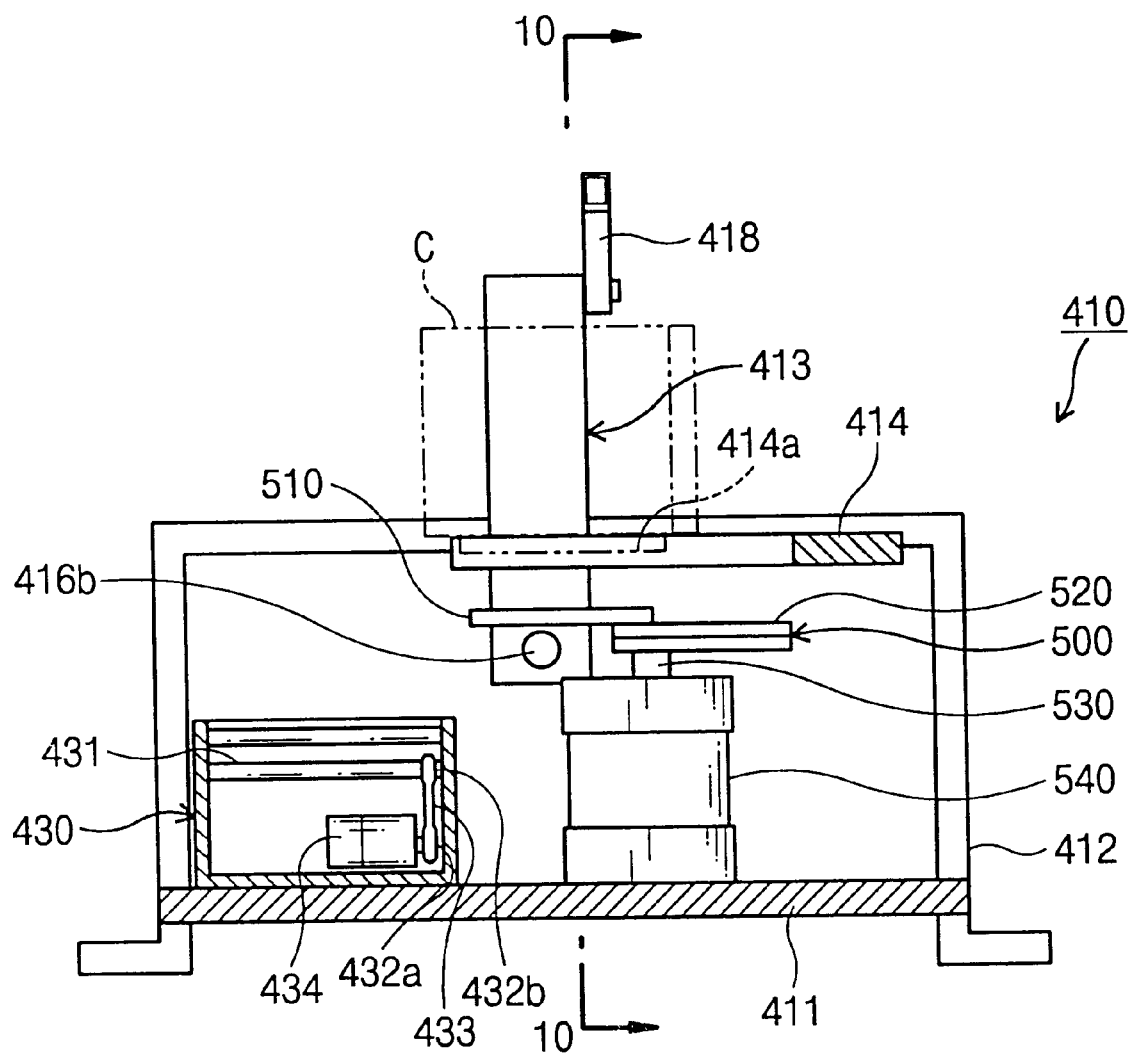
FIG. 9 is a cross section illustrating the wafer aligning mechanism of the etching apparatus of the invention.
Figure 10:
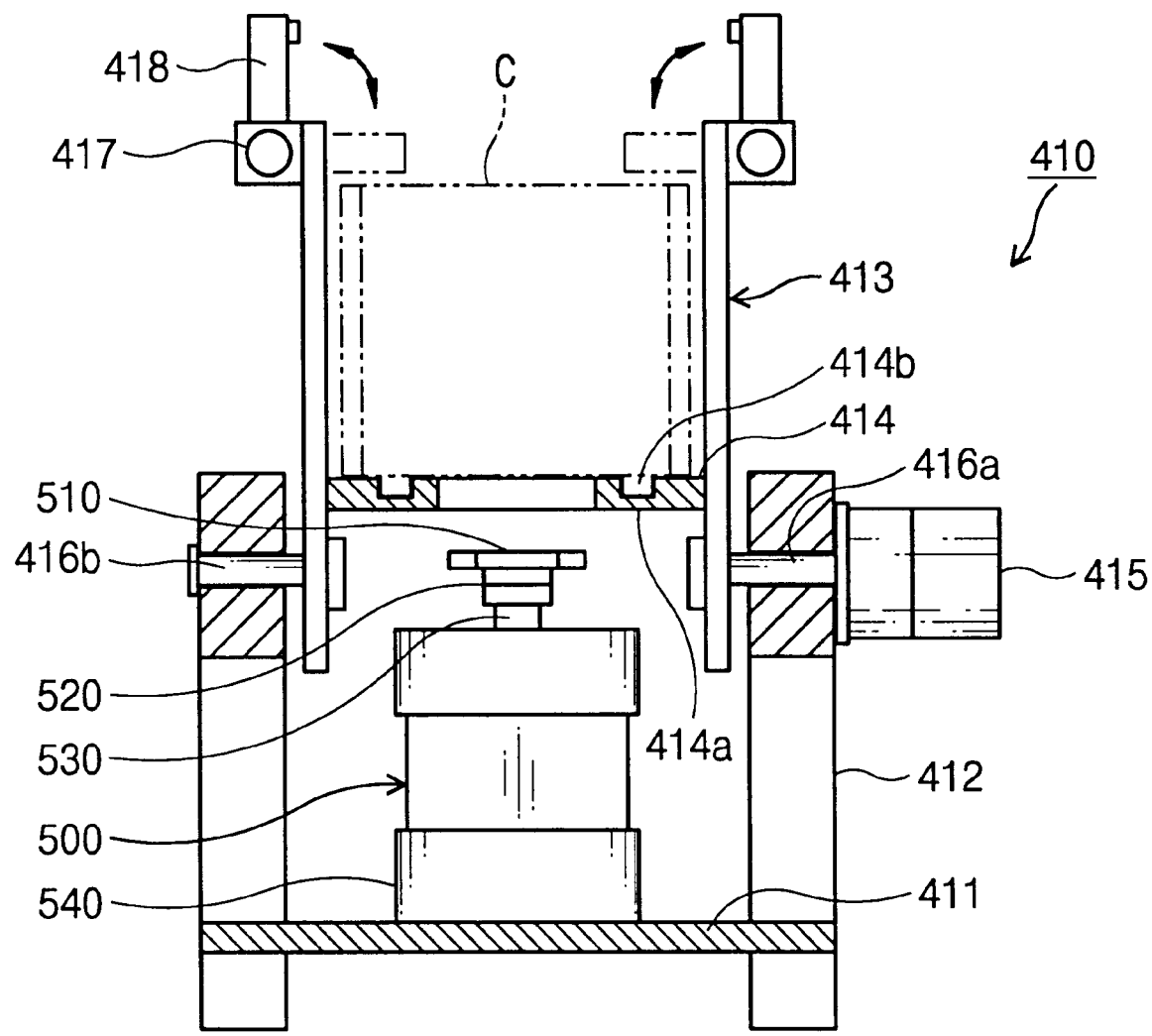
FIG. 10 is a cross section of FIG. 9 taken along line 1—1 illustrating a cassette fixing mechanism of the wafer aligning mechanisms in the etching apparatus of the invention.
Figure 13:
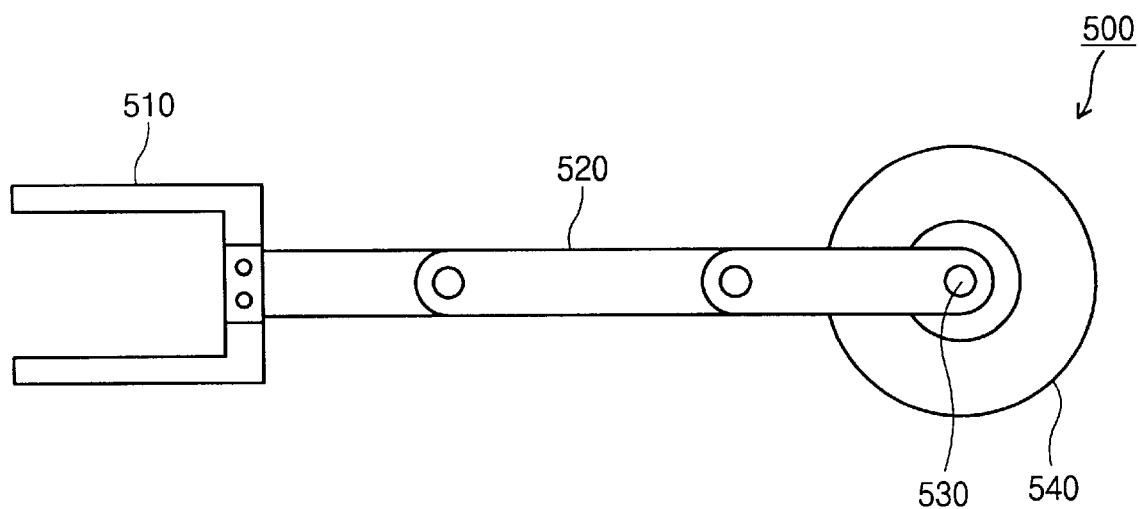
FIGS. 13 and 14 are top views illustrating the operation of a cassette transport mechanism in the etching apparatus of the invention.
Figure 14:
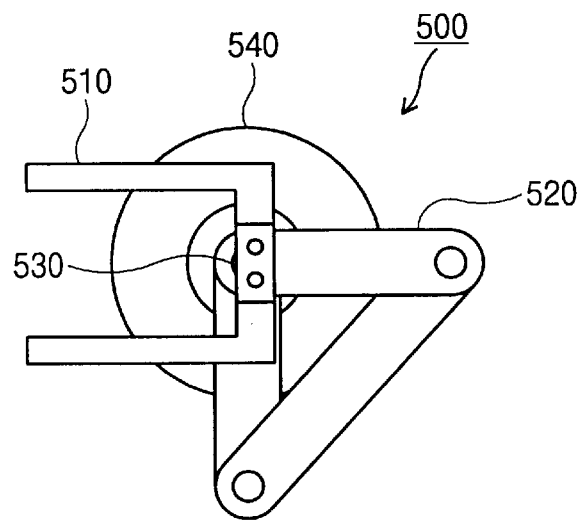

FIGS. 9, 13 and 14 depict the cassette transport mechanism 500 which includes a fork 510 for gripping and lifting the cassette C, three linkage arms 520 connected to the fork 510, a spindle 530 capable of moving the cassette C up and down and rotating the cassette C, and a drive mechanism 540 for driving the spindle 530. The drive mechanism 540 is positioned under the aligning plate 414, and is fixed to the base 411. Accordingly, as the spindle 530 is moved vertically by the drive mechanism 540, the fork 510 is first lifted up and then is put down on the cassette C. All of the three arms 520 can be either extended or folded by the forward and reverse rotation, respectively, of the spindle 530, so that the cassette C is transferred from the fixing table 211 of the cassette supply table 210 to the aligning plate 414 of the wafer aligning mechanism 410. From the aligning plate 414, cassette C is transferred to and from the elevator 310 in the load lock chamber 300.

The elevator 310 and the wafer transport mechanism 320 in the load lock chamber 300 are of a conventional design-known to those skilled in the art. Cassette C, placed by the cassette transport mechanism 500 onto elevator 310, is moved vertically by the elevator 310 in load lock chamber 300 as is illustrated in FIG. 4.

FIGS. 15 to 19 illustrate the process chamber 100 in which the wafer W, whose surface faces down during transfer from cassette supply chamber 200 to process chamber 100, is individually etched. Process chamber 100 includes a sealed chamber body 110. An opening 101, through which the wafer W passes, is formed on the side wall of the chamber body 110 next to load lock chamber 300, and is sealed with door 102. A cathode 111 to which the wafer W is held during etching, is installed in the top part inside the chamber body 110. A wafer loading mechanism is formed in the chamber body 110 for clamping the wafer W securely against the cathode 111 with the wafer processing surface facing down. The wafer loading mechanism includes a loader 121 for lifting the wafer W and elevating it to a first loading position P1 from which position the wafer W is transported using the fetch arm 321 of the wafer transporting mechanism 320; a holder 122 for lifting the wafer to a second loading position P2 from which position the wafer is clamped against the cathode 111 in conjunction with loader 121 after fetch arm 321 returns to the load lock chamber 300; and a driving means for operating loader 121 and the holder 122.

Figure 17:
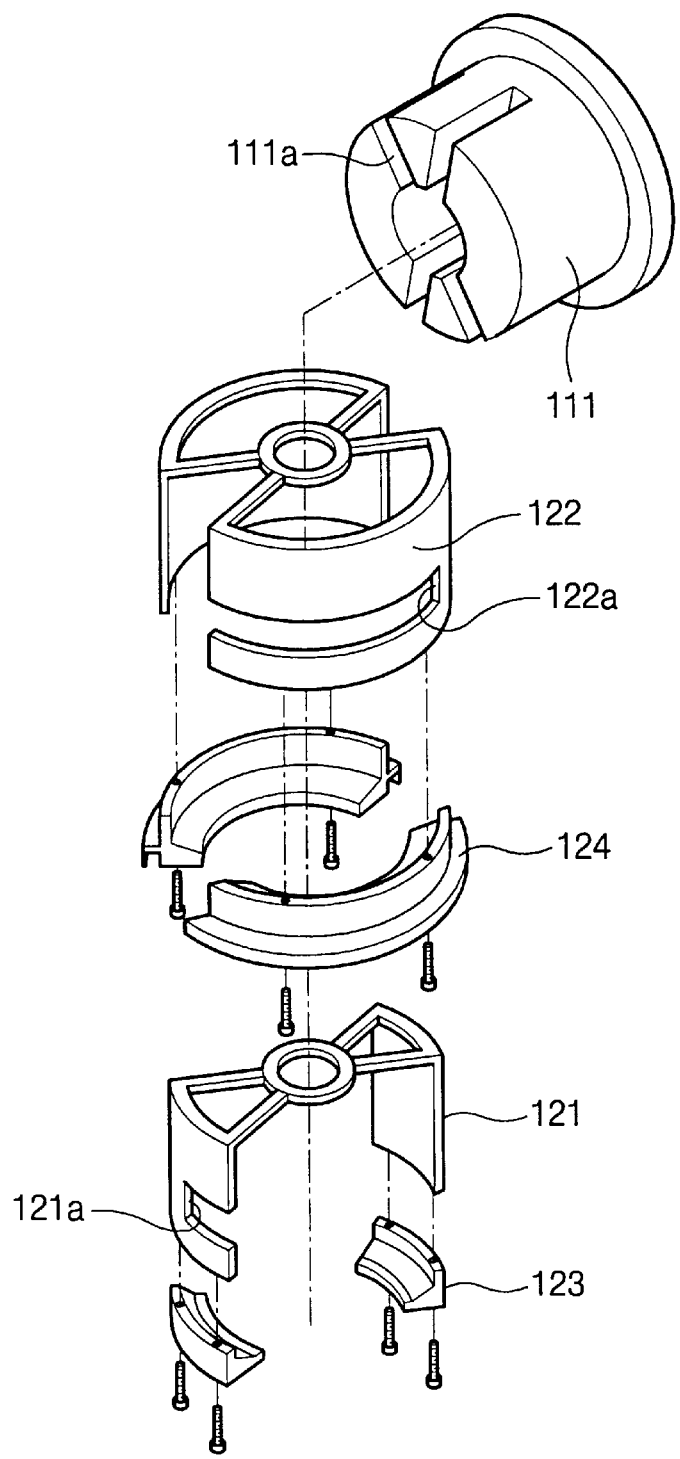
FIG. 17 is an exploded perspective illustrating a wafer loader mechanism in the process chamber of the etching apparatus of the invention.

The loader 121 and the holder 122, illustrated in FIG. 17, are installed on the external or lower side of the cathode 111, and together they form a cylinder. A groove 111a is formed in the cathode 111, which groove allows the loader 121 and the holder 122 to move up and down. Lifters 123 and 124 are attached to the bottom of the loader 121 and the holder 122. Each lifter grips the edges of the wafer W without damaging the processing surface. An opening is cut into the sides of the loader 121 and holder 122, openings 121a and 122a, respectively, so that the fetch arm 321 of the wafer transporting mechanism 320 can transfer the wafer W to and from loader 121 and holder 122 through the openings 121a and 122a.

Figure 15:
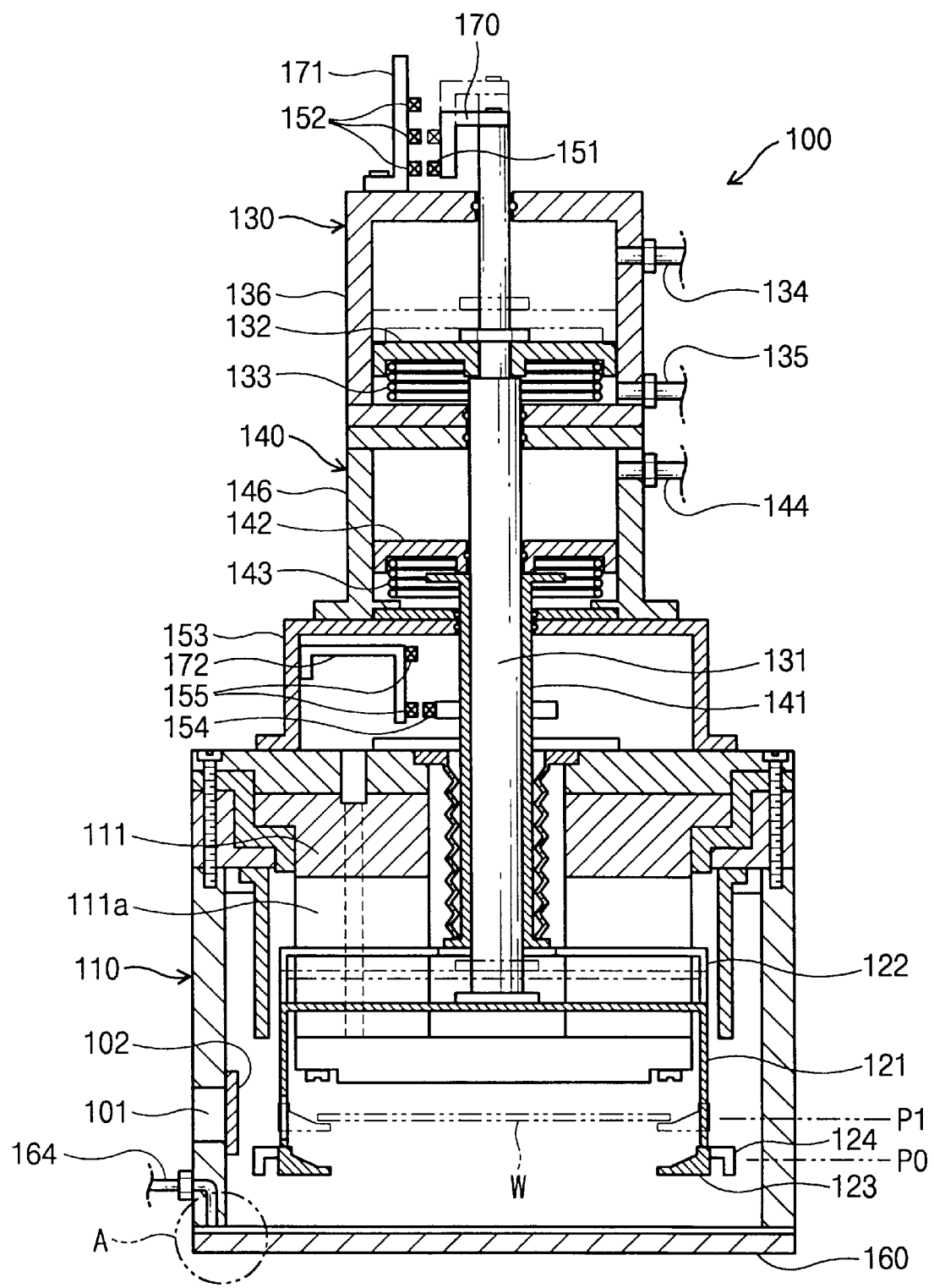
FIGS. 15 and 16 are cross sections illustrating the structure of the process chamber and its operation in the etching apparatus of the invention.
Figure 16:
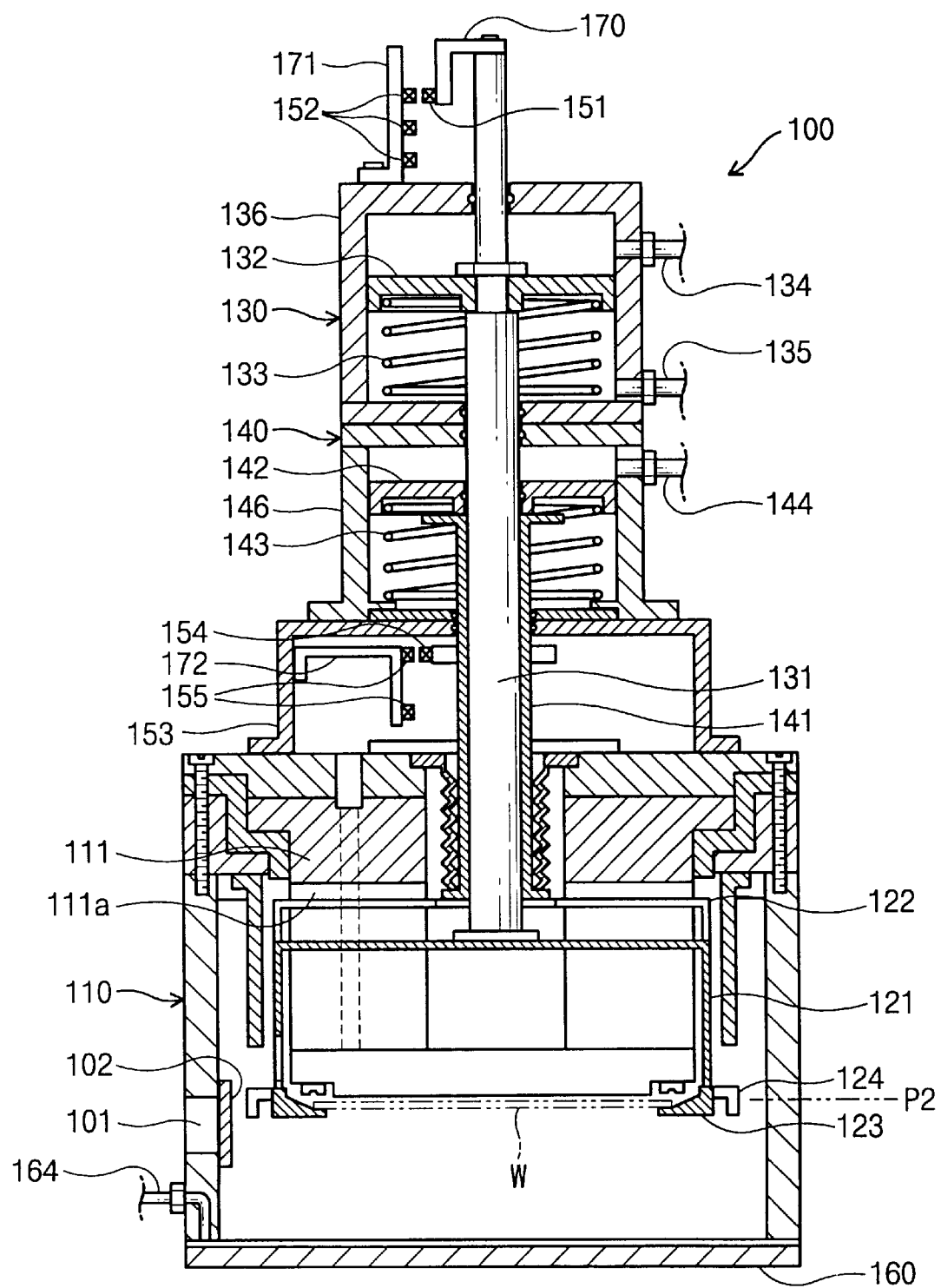

The actuating cylinders for the loader 121 and the holder 122 are formed vertically adjacent to one another as a first upper and a second lower cylinder 130 and 140, respectively, which are stacked on top of the chamber body 110. As is illustrated in FIGS. 15 and 16, an inner rod 131 passes through the center of the first and second cylinder housings 136 and 146, respectively, so that the lower part of the inner rod 131 suspends the cathode 111. The top hub of the loader 121 is attached to the end of inner rod 131. The opposite end of the inner rod 131 passes through the first cylinder housing 136 and is exposed to the outside of the process chamber. A first piston 132 is fixed to the inner rod 131, positioned in the first cylinder housing 136. A spring 133 is installed beneath the first piston 132 in the first cylinder housing 136 to push the first piston 132 upward. Air supplying lines 134 and 135 are respectively connected above and below the first piston 132 in the first cylinder housing 136 in order to selectively supply air to housing 136 in order to pneumatically drive the first piston 132 up and down.

The inner rod 131 moves up and down with the movement of the first piston 132, causing the loader 121 to move up and down so that the wafer loading operation of the loader 121 is controlled with the first cylinder 130. The spring 133 provides the restoring force. The spring provides the force for the loader 121 to clamp the wafer W in second loading position P2 securely against the cathode 111, thereby preventing the wafer from being damaged by excessive pressure.

A second rod 141 is installed outside of the inner rod 131, having a lower end that passes through the cathode 111 and that is attached to the top hub of the holder 122 at a central position. The upper end of the second rod 141 terminates in the second cylinder housing 146 where a second piston 142 is fixed to the second rod 141. A spring 143 is installed beneath the second piston 142 in the second cylinder housing 146. The air supply 144 is connected to wall of the second cylinder housing 146 above the second piston 142 installed in housing 146, so that the second piston 142 is pneumatically driven downward.

As the second rod 141 moves down according to the movement of the second piston 142 under air pressure, the holder 122 also moves downward. The spring 143 is compressed until the air pressure is released at which time the second piston 142 returns to its original position, due to the restoring force of the spring 143. The upward-movement of the second rod 141 and the holder 122 fixed to its lower end is thus enabled, and the wafer clamping operation of the holder 122 is accomplished with the second cylinder 140. The wafer W is fixed by the holder 122, utilizing the elasticity of the spring 143.

The loader 121 is controlled by a position controller to move to a stand-by position Po before the wafer W is supplied, then to a the first loading position P1 for receiving the supplied wafer W from the fetch arm 321, and finally to the second loading position P2 for clamping the wafer W to the cathode 111. The position controlling means is made of sensors installed on the top of the first cylinder housing 136 and on the upper part of the inner rod 131 that extends outside of the top of the process chamber.

In a preferred embodiment, the sensors are light emitters and/or photo sensors known in the art. One light emitter 151 is installed on an arm 170 attached to the top part of inner rod 131 and three photo sensors 152 are installed on a vertical member 171 that is fixed to the outside top part of the first cylinder housing 136, with the photo sensors positioned on the vertical member 171 so that each photo sensor is opposite to the light emitting sensor 151. The position of the first photo sensor determines the stand-by position P0 of the loader 121; the second photo sensor determines the first loading position P1, and the third photo sensor determines the second loading position P2 of the loader 121 at which position the wafer is clamped to the cathode 111.

The holder 122 is controlled by a position controller incorporating sensors installed on the second rod 141 between the second cylinder 140 and the top of the chamber body 110 within bracket 153. As with the position control means of the loader 121, light emitters and photo sensors are preferable. One light emitting sensor 154 is attached to the outside of the second rod 141. Two photo sensors 155 are attached to the inside of the bracket 153 installed between the second cylinder 140 and the top of the process chamber body 110 through an arm 172, so that each photo sensor 155 is opposite to the light emitting sensor 154 and is positioned so that the first photo sensor determines the stand-by position P0 of the holder and the second photo sensor determines the second clamping position P2 of the holder.

An example of a loading operation of the wafer W in the present etching apparatus is set forth below:

The wafer W, whose processing surface faces down, is inserted through the openings 121a and 122a in the loader 121 and the holder 122, respectively, by the fetch arm 321 of the wafer transport mechanism 320 when the loader and the holder are positioned in the stand-by position P0. A pneumatic controller, (not shown) supplies air to the air supplying line 135 of the first cylinder 130 to pneumatically drive first piston 132 up and down and thereby lift and lower the inner rod 131.

The lifter 123 attached to the loader 121 moves up, thereby receiving the wafer W from fetch arm 321. Simultaneously, the light emitter sensor 151 that is attached to the inner rod 131 contacts the central photo sensor 152. The central photo sensor 152 receives the light signal from the light emitter 151 and supplies a signal to the pneumatic controller. The pneumatic controller supplies air to the air supplying lines 134 and 135 to stop the inner rod 131 so that the loader 121 stops at the first loading position P1 for receiving the wafer W.

As described above, the fetch arm 321 having transferred the wafer W returns to the load lock chamber 300 when the loader 121 stops at the position P1. The inner rod 131 is again activated to lift the loader 121 to the second loading position P2. The loader 121 stops at the second loading position P2, controlled by the light emitter 151 installed on the inner rod 131 and the photo sensor 152 which is located opposite to the light emitter 151, thereby clamping the wafer W against the cathode 111 with its processing surface facing down.

As the loader 121 shifts from first loading position P1 to second loading position P2, the second cylinder 140 is activated to lift the second rod 141. This causes holder 122 to move from stand-by position P0 to second loading position P2. Holder 122 is stopped at the second clamping position P2 by the light emitter 154 and the photo sensor 155.

The lifter 124 of the holder 122 holds the outside of the wafer W and clamps wafer W to the cathode 111 so that the wafer W is etched with its processing surface facing down. The clamping force on the wafer W is imparted by springs 133 and 143, installed in the first and second cylinders 130 and 140, respectively. The tension on springs 133 and 143 is adjusted so that excessive force is not applied to the wafer.

To unload a wafer W that has been etched, the loading steps set forth above are performed in the reverse order. That is, the inner and second rods 131 and 141 descend simultaneously, driven by first and second cylinders 130 and 140, respectively. The loader 121 stops at P1, controlled by the light emitter and photo sensor 151 and 152, respectively, while the holder 122 descends to position P0, controlled by sensors 154 and 155. At this point, the fetch arm 321 is inserted through openings 121a and 122a and is placed under the wafer W. The wafer W is transferred to the fetch arm 321 when the lifter 123, because the first rod 131 drops further, driven by the first cylinder 130, taking the loader 121 to the stand-by position P0. The fetch arm 321 returns the wafer W to the cassette C sitting on elevator 310 in the load lock chamber 300 through openings 121a and 122a in the loader 121 and the holder 122, respectively.

Each wafer W stacked in the cassette C is sequentially loaded into the process chamber 100, etched, and unloaded. The loading and unloading operations are repeated until each wafer has been etched.

Figure 18:
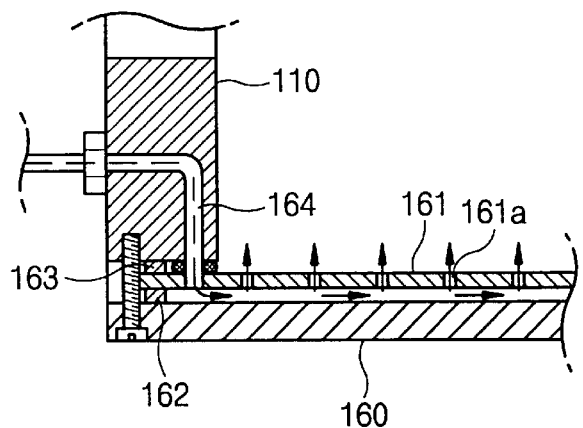
FIG. 18 is a detail of part A shown in FIG. 15.

FIG. 18 illustrates part A of FIG. 15 in detail, showing how the process gas is supplied to process chamber 100. With the surface of the wafer W facing down, the process gas is supplied to the bottom of the chamber body 110. Specifically, a lower cover 160 is installed at the bottom of the chamber body 110. A gas spray plate 161 is installed between the chamber body 110 and the lower cover 160 with predetermined orifice sizes. Seals 162 and 163 are mounted between the chamber body 110 and the gas spraying plate 161, and the gas spraying plate 161 and the lower cover 160, respectively.

Figure 19A:
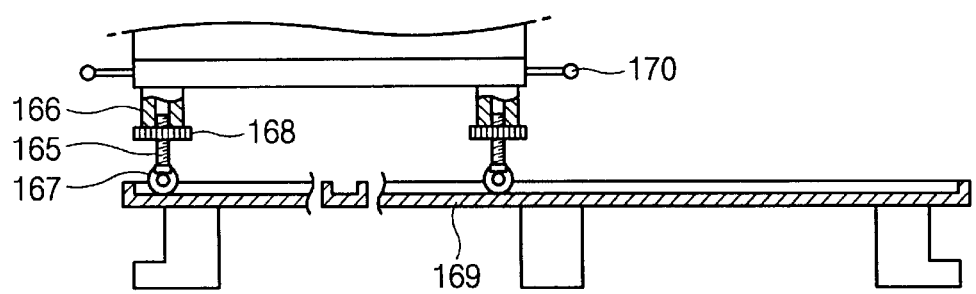
FIGS. 19A and 19B illustrate the operation of separating the lower cover from the process chamber in the etching apparatus of the invention.
Figure 19B:
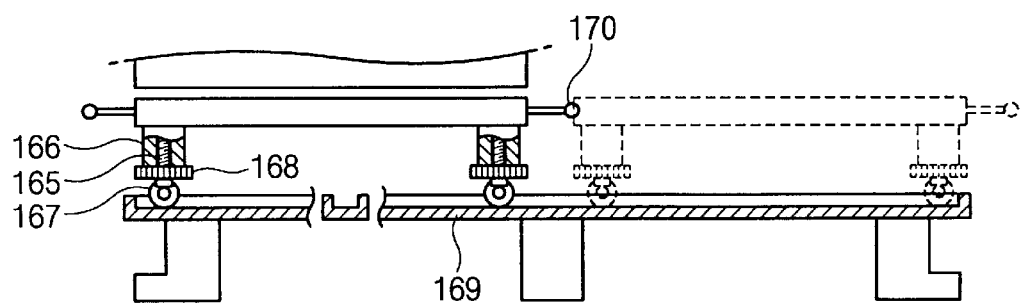

The gas supply line 164 is attached to one side of the chamber body 110. One end of the gas supplying line 164 passes through the gas spraying plate 161 and terminates between the gas spraying plate 161 and the lower cover 160, so that gas is supplied in the space separating them. The process gas transmitted through the line 164 is supplied to the bottom of the chamber body 110 through the gas orifices 161a formed in the gas spraying plate 161. The lower cover 160 can be separated from the chamber body 110 to facilitate easy repair and cleaning. As FIGS. 19A and 19B illustrate, multiple bosses 166 are attached the bottom of the lower cover 160 to which multiple threaded supporting legs 165 are inserted. Wheels 167 are attached to the bottom of each supporting leg 165, and a means for raising and lowering lower cover 160 is respectively screwed to the supporting legs 165. Each wheel 167 is guided along rails 169 which extend outside of the chamber body 110. A handle 170 is attached to either side of the lower cover.

A preferred embodiment is shown in FIG. 19A. Here, a leveler 168 is screwed onto the threaded area of the supporting leg 165 and is rotated to lift and lower the lower cover 160. The leveler 168 can be rotated to push the lower cover 160 up so that it presses against the bottom of the chamber body 110 thereby sealing the inside of the chamber. When disassembling the lower cover 160 for repair and cleaning, the leveler 168 is rotated to lower the cover 160. When lowered, the handle 170 of the lower cover 160 can be pulled, causing the cover 160 to roll on wheels 167, guided by the rail 169, so that the lower cover 160 is easily removed from the chamber body 110 and shifted from side to side.

The etching apparatus for manufacturing the semiconductor devices of the present invention transfers wafers W housed in a cassette C between the cassette supply chamber 200 to the process chamber 100 with the wafer processing surfaces facing down. The etching process is performed on the downward-facing processing surface which reduces particle contamination thereby increasing production yield by reducing the defect ratio. In addition, when supplying the wafer from the cassette supply chamber 200 to the elevator 310 of the load lock chamber 300, multiple wafers are stacked in the cassette C so that wafer transport time is reduced. Further, the present invention permits the simultaneous alignment of multiple wafers stacked in the cassette thereby reducing the wafer alignment time. The etching apparatus of the present invention therefore reduces the total process time, and increases productivity.

The present invention is not limited to the embodiments set forth above, and it is clearly understood that many variations may be made within the scope of the present invention by anyone skilled in the art.

What is claimed is:

1. An etching apparatus for manufacturing semiconductor devices, comprising:

one or more process chambers for etching a wafer, the wafer having a processing surface facing down, the one or more process chambers being maintained under a vacuum;

a cassette supply chamber for supplying a plurality of wafers to the one or more process chambers, the cassette supply chamber having a cassette supply table for receiving a cassette, the cassette having two or more supporting legs and housing a plurality of wafers stacked in the cassette with processing surfaces facing down, the cassette supply chamber being maintained under atmospheric conditions;

a load lock chamber for transferring the wafers housed in the cassette from the cassette supply chamber to the one or more process chambers, the load lock chamber being installed between the one or more process chambers and the cassette supply chamber, the load lock chamber having an elevator for moving the cassette up and down, and having a wafer transporting mechanism for transferring the wafers from the cassette to the one or more process chambers one by one while maintaining orientation of each wafer with the processing surface facing down;

a cassette transport mechanism for transferring the cassette from the cassette supply table in the cassette supply chamber to the elevator in the load lock chamber; and a wafer aligning chamber containing a wafer aligning mechanism installed between the cassette supply chamber and the load lock chamber for simultaneously aligning multiple wafers stacked in the cassette, and for transferring the cassette with aligned wafers stacked therein to the load lock chamber.

2. The etching apparatus as claimed in claim 1, wherein each of the one or more process chambers comprise:

a chamber body encompassing a sealed volume, and having a removable lower cover and a side opening in communication with the load lock chamber, the side opening being sealed by a door;

a cathode installed in a top part inside the chamber body, so that a wafer may be clamped to the cathode with the processing surface facing down;

a wafer loading mechanism for receiving the wafer supplied to the process chamber from the load lock chamber, and for clamping the wafer against the cathode; and a process gas supplying component installed in a bottom of the chamber body for supplying a process gas to the process chamber for etching the processing surface of the wafer.

3. The etching apparatus as claimed in claim 2, wherein the wafer loading mechanism comprises:
- a loader that moves up and down between a plurality of positions including a stand-by position which allows a wafer to be inserted into the loader, a first loading position above the stand-by position, and a second loading position above the first loading position, for adhering the wafer to the cathode with the processing surface facing down;
- a holder that moves up and down between a plurality of positions including the stand-by position which allows the wafer to be inserted into the holder, and the second loading position which permits the holder to clamp the wafer against the cathode with the processing surface facing down;
- a driver that moves the loader and the holder up and down between the respective positions; and
- a position controller, for stopping the loader and the holder precisely at the respective positions.

4. The etching apparatus as claimed in claim 3, wherein lifters are fixed to the bottom of the loader and the holder to support an outside portion of the wafer when transporting and clamping the wafer.

5. The etching apparatus as claimed in claim 3, wherein the driver comprises:
- a first upper actuating cylinder housing and a second lower actuating cylinder housing stacked on top of the chamber body;
- concentric inner and outer rods passing through sealed openings in the first and second cylinder housings,
- the inner rod passing through a center of the first and second cylinder housings, a lower part of the inner rod passing through the chamber body, a lower end of the inner rod suspending the cathode and being attached to a top hub of the loader at a central position, and an upper part of the inner rod passing through the first cylinder housing to an outside of the process chamber, and
- the outer rod having an upper part which terminates in the second cylinder housing, a lower end of the outer rod passing through the chamber body and being attached to a top hub of the holder at a central position;
- a first piston fixed to the inner rod and positioned in the first cylinder housing;
- a second piston fixed to the outer rod and positioned in the second cylinder housing;
- springs installed under the first and second pistons in the first and second cylinder housings respectively, to supply upward restoring forces; and
- air supplying lines for supplying air pressure to the first and second cylinder housings to pneumatically actuate the first and second pistons up and down.

6. The etching apparatus as claimed in claim 5, wherein the position controller comprises:
- a light emitter installed on an arm attached to the upper part of the inner rod; and
- first, second and third photo sensors installed on a vertical member that is fixed to an outside top part of the first cylinder housing, the photo sensors being positioned on the vertical member opposite to the light emitter so that the first photo sensor determines the stand-by position of the loader, the second photo sensor determines the first loading position of the loader, and the third photo sensor determines the second loading position of the loader.

7. The etching apparatus as claimed in claim 5, wherein the position controller comprises:
- a light emitter attached to a portion of the outer rod between the second cylinder housing and the chamber body; and
- first and second photo sensors attached to a bracket installed between the second cylinder housing and a top of the process chamber by an arm, the photo sensors being positioned opposite to the light emitter so that the first photo sensor determines the stand-by position of the holder and the second photo sensor determines the second loading position of the holder.

8. The etching apparatus as claimed in claim 2, wherein the process gas supplying component comprises:
- a gas spray plate installed in the bottom of the chamber body and above the removable lower cover, the gas spray plate having a plurality of gas orifices and being installed at a predetermined interval with respect to the removable lower cover;
- seals between the chamber body and the gas spray plate, and between the gas spray plate and the removable lower cover that seal the chamber body; and
- a gas supply line passing through a lower sidewall of the chamber body, one end of the gas supply line passing through the gas spray plate and terminating between the gas spray plate and the removable lower cover, to supply gas to the predetermined interval between the gas spray plate and the removable lower cover.

9. The etching apparatus as claimed in claim 2, wherein the removable lower cover is removably attachable in the process chamber and comprises:
- a plurality of bosses attached to a bottom thereof; and
- a plurality of threaded supporting legs inserted into the bosses.

10. The etching apparatus as claimed in claim 9, wherein the removable lower cover further comprises a plurality of levelers threaded onto threaded portions of the threaded supporting legs, the levelers being adjustable to raise and lower the removable lower cover to support the bosses.

11. The etching apparatus as claimed in claim 9, further comprising:
- wheels attached to a bottom of each of the threaded supporting legs; and
- a plurality of rails attached to a base for guiding the wheels, the rails extending beyond the chamber body for a distance which is at least as long as a width of the removable lower cover, the removable lower cover being rollable on the wheels along the rails in a horizontal direction to a position alongside the chamber body.

12. An etching apparatus for manufacturing semiconductor devices, comprising:
- one or more process chambers for etching a wafer, the wafer having a processing surface facing down, the one or more process chambers being maintained under a vacuum;
- a cassette supply chamber for supplying a plurality of wafers to the one or more process chambers, the cassette supply chamber having a cassette supply table for receiving a cassette, the cassette having two or more supporting legs and housing a plurality of wafers stacked in the cassette with processing surfaces facing down, the cassette supply chamber being maintained under atmospheric conditions;
- a load lock chamber for transferring the wafers housed in the cassette from the cassette supply chamber to the one or more process chambers, the load lock chamber being installed between the one or more process chambers and the cassette supply chamber, the load lock chamber having an elevator for moving the cassette up and down, and having a wafer transporting mechanism for transferring the wafers from the cassette to the one or more process chambers one by one while maintaining orientation of each wafer with the processing surface facing down; and a cassette transport mechanism for transferring the cassette from the cassette supply table in the cassette supply chamber to the elevator in the load lock chamber, the cassette supply table including
  a base table,
  multiple fixing tables stacked at a predetermined interval from each other for receiving the cassette, each of the fixing tables having a supporting board on which the cassette is laid and having vertical bars attached to both sides of the supporting board, the fixing tables having a support column fixed to a bottom of a lowest fixing table and passing through a lower base table,
  fixing elements that fix the cassette on the fixing tables, and
  a vertical shifter that raises and lowers the fixing tables.

13. The etching apparatus as claimed in claim 12, wherein each of the fixing elements comprises:
  pneumatic actuating cylinders installed under the vertical bars of the fixing table; and
  a clamping bar installed in upper parts of the vertical bars for clamping a top of the cassette, and being movable by the pneumatic actuating cylinders, the pneumatic actuating cylinders having cylinder rods that are attached to a free end of the clamping bar thereby enabling the clamping bar to clamp and release the cassette.

14. The etching apparatus as claimed in claim 12, wherein the vertical shifter comprises:
  a latitudinal plate connected to a lower side of the lowest fixing table;
  a ball screw passing through the base table and the latitudinal plate, and extending upward through the latitudinal plate;
  a ball bearing disposed within the latitudinal plate, between the latitudinal plate and the ball screw, the ball bearing being guided by the ball screw and enabling the latitudinal plate to shift up and down according to rotational direction of the ball screw;
  multiple guide rods passing through the latitudinal plate on both sides of the ball screw, supporting up/down movement of the latitudinal plate, lower parts of each of the guide rods being attached to the base table;
  a motor for rotating the ball screw; and
  a pair of pulleys and a belt for transmitting power from the motor to rotate the ball screw.

15. The etching apparatus as claimed in claim 1, wherein the wafer aligning mechanism comprises:
  a base to which a vertical frame is attached;
  an aligning table on which the cassette is laid, the aligning table being rotatably installed in the vertical frame;
  a wafer aligner, installed on the base, for simultaneously aligning multiple wafers stacked in the cassette, so that flat edges of the multiple wafers are set in a same direction; and
  a driver that rotates the aligning table and places the cassette on the wafer aligner.

16. The etching apparatus as claimed in claim 15, wherein the aligning table comprises:
  an aligning plate that receives the cassette, the aligning plate having a slide prevention groove into which the supporting legs of the cassette are inserted; and
  a clamper that clamps the cassette to the aligning plate.

17. The etching apparatus as claimed in claim 16, wherein the cassette transport mechanism comprises:
  a spindle for rotating and moving the cassette up and down;
  a drive mechanism for driving the spindle, the drive mechanism being positioned under the aligning plate and fixed to the base of the wafer aligning mechanism;
  a fork for gripping and lifting the cassette; and
  a plurality of arms connecting the spindle to the fork.

* * * * *